United States Patent [19]

Brooks

[11] 4,007,384
[45] Feb. 8, 1977

[54] NONINVERTING CURRENT-MODE LOGIC GATE

[75] Inventor: Richard Donald Brooks, Emmaus, Pa.

[73] Assignee: Bell Telephone Laboratories, Incorporated, Murray Hill, N.J.

[22] Filed: Dec. 8, 1975

[21] Appl. No.: 638,816

[52] U.S. Cl. .......................... 307/218; 307/299 A; 307/296

[51] Int. Cl.² ...................................... H03K 17/00

[58] Field of Search .......... 307/215, 218, 219, 296, 307/299 AB; 330/30 D

[56] References Cited
UNITED STATES PATENTS

| | | | |
|---|---|---|---|
| 3,523,194 | 8/1970 | Sheng | 307/296 |
| 3,539,824 | 11/1970 | Yu et al. | 307/218 |
| 3,629,610 | 12/1971 | Wilhelm | 307/218 |
| 3,869,623 | 3/1975 | Mimner | 307/296 |

Primary Examiner—Stanley D. Miller, Jr.
Assistant Examiner—B. P. Davis
Attorney, Agent, or Firm—H. W. Lockhart

[57] ABSTRACT

A high speed bipolar noninverting current-mode logic AND gate is the basic building block for a current-mode logic family. The AND gate comprises a current steering differential pair of transistors, a pair of dual emitter input transistors, a dual emitter reference transistor, an output resistor and a fixed current source. The conducting state of the current steering transistor pair is so controlled that a logic "one" at the base electrodes of both input transistors produces a logic "one" at an output terminal taken from the collector electrode of the reference transistor. Further, a logic "zero" at both input transistors produces a logic "zero" at the output terminal and finally the condition of a "zero" at one input and a "one" at the other input produces a "zero" at the output. This result is attained as a consequence of control of the conduction state of the current steering pair so as to provide the same current level through the reference transistor for the "zero-one" input as for the "zero-zero" input, thus producing the noninverting AND function.

3 Claims, 6 Drawing Figures

AND/NAND

OR/NOR

NONINVERTING CURRENT-MODE LOGIC GATE

This invention relates to logic circuits and more particularly to a current-mode logic AND gate in a semiconductor integrated circuit.

BACKGROUND OF THE INVENTION

The advantageous configurations and operation of current-mode logic is well known. A multiple input current-mode logic NOR gate exhibits a propagation delay which is longer, and a stronger function of temperature than the propagation delay for a multiple input current-mode logic OR gate. One reason is that the maximum forward bias across the base-collector junction of the output transistor is one-half of a logic voltage swing for the OR gate, but a full logic voltage swing for the NOR gate. A second reason is that the capacitance at the output node is lower for the OR gate because the collector of only one transistor is connected to the output node and all the collectors for the input transistors are connected directly to the most positive supply voltage. For a given logic function implementation, the number of noninverting OR gates could be maximized without increasing the number of stages of delay if a compatible noninverting AND gate was available. Accordingly, an object of this invention is a noninverting current-mode logic AND gate which is compatible with other current-mode logic configurations.

It is a further object of the invention also to provide current-mode logic circuits of the OR/AND configuration having enhanced speed and greater packing density than heretofore realized in such logic arrangements.

SUMMARY OF THE INVENTION

In accordance with an embodiment of the invention a current-mode AND gate comprises a current steering differential pair of transistors, a pair of dual emitter input transistors and a dual emitter reference transistor. The reference transistor is differentially connected with each of the input transistors by way of its dual emitters. Each of these emitter connections is connected to the collector of one of the current steering transistors. The other emitters of the input transistors are connected in crossed relationship to the base electrodes of the current steering transistors. Thus, one emitter of an input transistor is connected to the collector of one current steering transistor and the other emitter of that input transistor is connected to the base of the other current steering transistor.

The conducting state of the current steering transistors is controlled so that a logic "one" at the base electrodes of both input transistors produces a logic "one" at an output terminal taken from the collector electrode of the reference transistor. A logic "zero" at both inputs produces a "zero" at the output. However, in the important condition in which the inputs differ, one being "zero" and the other a "one", the output is a "zero" in conformity to the AND function. This result is produced by the current steering effect of the differential transistor pair which effectively provides substantially the same current level through the reference transistor for the "one-zero" inputs as for the "zero-zero" inputs.

Thus, a feature of the logic gate in accordance with this invention is a current steering pair of transistors controlled by the condition of the pair of input transistors.

BRIEF DESCRIPTION OF THE DRAWING

The invention and its other objects and features will be better understood from the following description taken in conjunction with the drawing in which.

DETAILED DESCRIPTION

In the specific embodiments disclosed hereinafter the explanation will be in terms of positive logic in which the allocation of the logical "one" is to the more positive value and the logical "zero" to the more negative value of the binary input or output potential values. Moreover, these embodiments utilize transistors of the N-P-N type but could utilize P-N-P devices throughout as well, with suitable changes in the polarity of applied voltage and negative logic may be used for either type of transistor.

Figure 1:
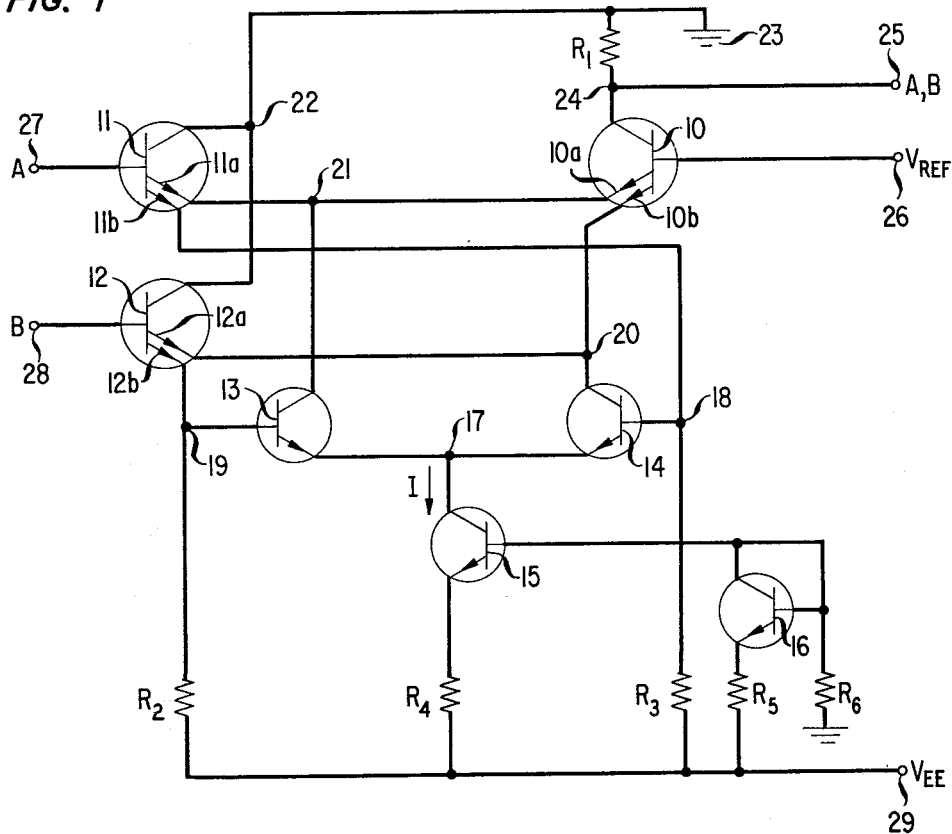
FIG. 1 is a circuit schematic depicting one basic embodiment of the current mode logic gate in accordance with this invention.

The noninverting current-mode logic AND gate of FIG. 1 comprises a pair of dual emitter input transistors 11 and 12, a dual emitter reference transistor 10, and a pair of differentially connected current steering transistors 13 and 14. A constant current source comprising transistor 15 and diode-connected transistor 16 feeds a current I to node 17 connected to the emitters of the differential pair 13 and 14. It will be understood that the current I may be derived from any conventional current source or from a shared source as in the case of $V_{REF}$.

The gate inputs A and B at terminals 27 and 28 respectively, are connected to the base electrodes of transistors 11 and 12, and output terminal 25 is connected to node 24 between the collector electrode of reference transistor 10 and ground terminal 23 through resistance element R1.

The input transistors 11 and 12 are differentially connected to the dual emitter reference transistor 10. Each of these emitter connections is connected to a collector electrode of one transistor of the current steering pair 13 and 14. Thus, emitters 10a and 11a are interconnected and further connected to node 21 to the collector electrode of transistor 13. Likewise, emitters 10b and 12a are connected with the collector electrode of transistor 14 at node 20.

The other emitter of each of the input transistors 11 and 12 is connected in crossed relationship to the base electrode of one of the current steering transistors 13 and 14. Thus emitter 11b is connected at node 18 to the base electrode of current steering transistor 14 and emitter 12b is connected at node 19 to the base electrode of current steering transistor 13. It will be understood that although the dual emitter configuration is conveniently fabricated in integrated form, a pair of transistors could be substituted if desired having their base and collector electrodes in common connection. However, in the configuration shown the integrated form may be exceedingly compact inasmuch as the input transistors 11 and 12 having their collectors connected directly to ground need not be isolated devices.

In a typical embodiment a voltage, $V_{EF}$ at supply terminal 29 has a value of −3.0 volts and the voltage, $V_{REF}$ at terminal 26 has a value of −215 mV, and the logic swing is 400 mV. Thus, inputs A and B at terminals 27 and 28, may have nominal values of zero or ground for high, and −400 mV for low. Small leakage currents will result in slight variations from these nominal values. Further, the resistances R1, R4 and R5 are 400 ohms, resistances R2 and R3 are 2380 ohms, and R6 has a value of 1786 ohms. In this configuration and for these circuit values the voltage at nodes 18 and 19 will swing between a high of about −0.7 volts and a low of about −1.1 volts.

In the operation of the embodiment in accordance with FIG. 1 the output at terminal 25 is high when, and only when no signal current is flowing through R1, node 24 and reference transistor 10. This condition obtains when inputs A and B at terminal 27 and 28 both are high with respect to $V_{REF}$. Thus in effect, when A and B are both logical "one" the output, reflecting the AND function, is A·B. All other input combinations must produce sufficient current flow through R1, node 24 and reference transistor 10 to provide a lower voltage at the output terminal 25.

The basis for this pattern of operation is provided by the current steering pair of transistors 13 and 14 under the control of inputs A and B. For all combinations of logic voltage inputs at terminals 27 and 28, that is, all high or low states of A and B, the portions of transistors 11 and 12 with emitters 11b and 12b will be in the conducting or "ON" state. Accordingly, the input voltage variables A and B, decreased by one diode voltage drop, appear as input voltage variables at nodes 18 and 19 and thus are applied to the base electrodes of the current steering pair of transistors 14 and 13, respectively. When these voltages are equal, the drain current I of the constant current source divides between the collectors of transistors 13 and 14 and appears similarly at nodes 21 and 20. When the base input voltage of one current steering transistor is high and one is low, substantially all of the current I flows through the current steering transistor having the higher base voltage.

For example, if inputs A and B are high, transistors 13 and 14 draw currents $kI$ and $(1-k)I$ respectively, where k for perfectly matched transistors would be ½. Because A and B are high, this current is drawn from emitter 11a of transistor 11 rather than emitter 10a of transistor 10 and from emitter 12a of transistor 12 rather than emitter 10b of transistor 10, as a consequence of the differential connections of the input transistors 11 and 12 with the reference transistor 10. Thus no current is drawn from transistor 10, except for permissible leakage current, and node 24 is high.

If inputs A and B both are low, currents $kI$ and $(1-k)I$ are drawn from emitters 10a and 10b of reference transistor 10 and the total, I, flows through R1 and a low of $-IR_1$ is exhibited at output node 24. If input A is high and input B is low all of the current I is drawn from node 20 and because input B is low relative to $V_{REF}$, emitter 12a of transistor 12 is "OFF" and all of the current I is drawn from emitter 10b of transistor 10. Thus the voltage at node 24 again is a low represented by $-IR_1$. This same result follows when the inputs are reversed and A is low and B is high. Thus, a logic low of $-IR_1$ is achieved at the output for the three input conditions of low-low, low-high and high-low, whereas a logic high results from the high-high input combination. In the context of this description the high is "one" and the low is "zero". Thus, the gate circuit in accordance with FIG. 1 provides the logic AND function.

Figure 3A:
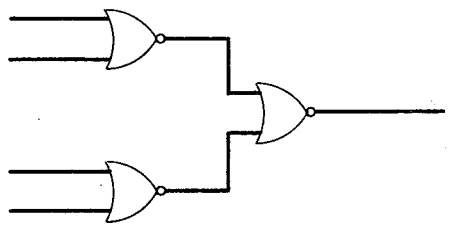
FIGS. 3A and 3B, and FIGS. 4A and 4B are logic diagrams illustrating applications of the foregoing circuits.
Figure 3B:
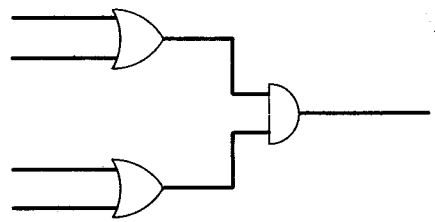

The usefulness of the noninverting AND gate in accordance with this invention can be illustrated by its application to a typical logic function implementation. Referring to FIG. 3A, a NOR gate implemented logic function is shown in which the output can be expressed in logic forms as $(\overline{A + B}) + (\overline{C + D})$. From the second law of De Morgan, the logic output set forth above is the equivalent of the expression, $[(A + B) \cdot (C + D)]$. This logic result is achieved by the implementation of FIG. 3B utilizing the input OR gates coupled to the noninverting AND gate in accordance with this invention. Thus all inverter stages have been eliminated and no additional stages of delay have been added by the use of the AND gate in accordance with this invention. In general, a NOR implemented logic path thus can be reduced to a path with at most one inversion by using noninverting OR and AND gates.

The noninverting current-mode logic AND gate described above may be extended to provide a universal current-mode logic gate readily capable of either AND/NAND functions or alternatively OR/NOR. An embodiment of such a universal gate is shown in schematic form in FIG. 2 which includes the constant current source comprised of transistors 57 and 58 and differentially-connected current steering transistors 55 and 56 connected to the source at node 59. Transistors 51–54 comprise the input transistors analogous to those of the basic embodiment of FIG. 1, separated however so as to enable separate base and collector connections. Reference transistor 50 of the dual emitter configuration corresponds to reference transistor 10 of FIG. 1 in its relationship to the output denoted Q at terminal 65.

Figure 2:
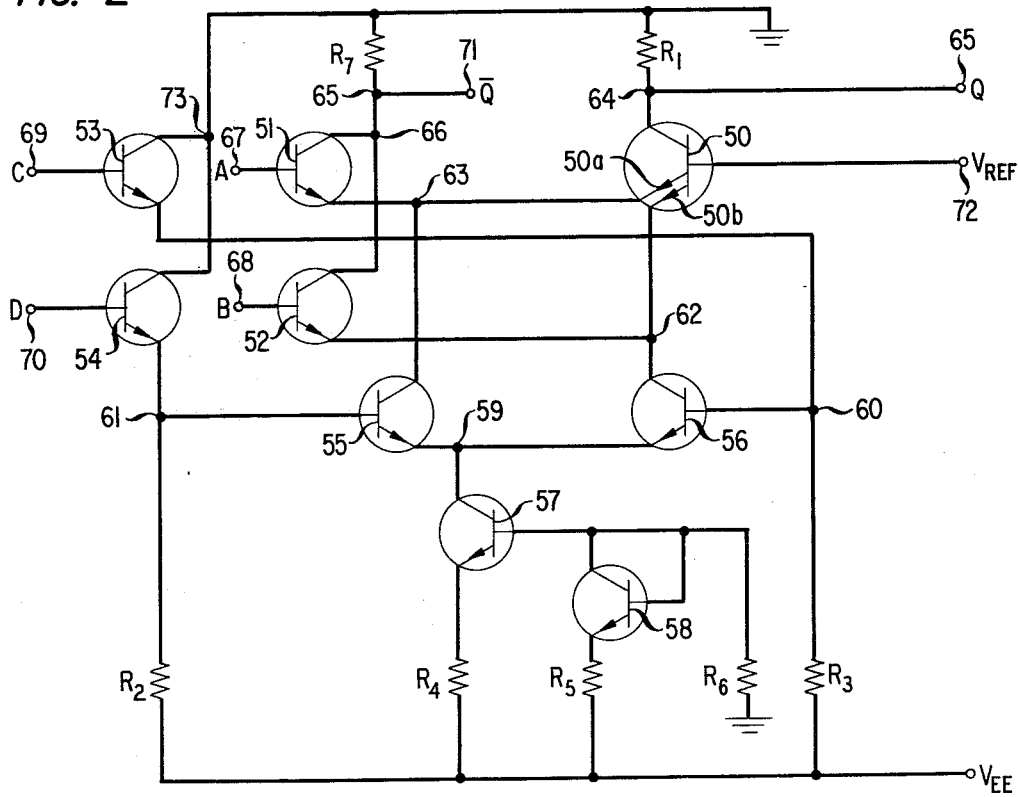
FIG. 2 is a circuit schematic of another embodiment applying the principles of this invention to a universal current-mode logic gate.

In the circuit of FIG. 2 the collector electrodes of input transistors 51 and 52 are interconnected to node 65 and to the inverted output $\overline{Q}$ at output terminal 71. Resistance element R7 corresponds to R1 to provide the requisite voltage drop for producing a low output when current flows. The circuit parameters of this circuit are similar to those set forth above for the embodiment of FIG. 1 with the addition, as just noted, that R7 has the same value as R1, namely 400 ohms.

Figure 4A:
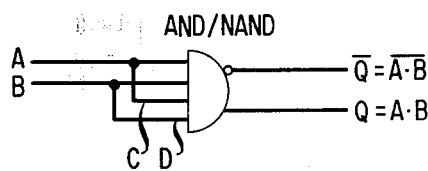
Figure 4B:
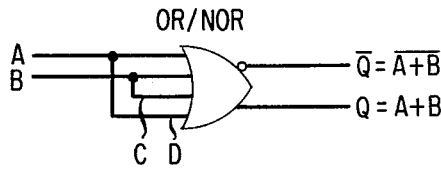

Referring to FIGS. 4A and 4B the universal gate of FIG. 2 is a two-input gate which exhibits the differing logic functions depending on the pairing of the inputs. For the AND/NAND functions of FIG. 4A, A and C are connected which produces a configuration similar to that of the circuit of FIG. 1. Thus the operation is similar with the addition that an inverted output is exhibited at terminal 71. This is apparent inasmuch as when Q is high by virtue of no current flow through node 64, then current will flow through node 65 resulting in a voltage drop occasioned by R7 and $\overline{Q}$ will be low.

In the arrangement illustrated in FIG. 4B, A and D are interconnected and B and C are interconnected. This connection provides the standard OR function. If A-D and B-C are both high, reference transistor 50 will be held OFF and Q will be high. If both pairs A-D and B-C are low, transistor 50 will be ON and the divided current through the current steering transistors 55 and 56 will sum in transistor 50 and Q will be low conforming to the OR function. The output $\overline{Q}$ will be high indicating the NOR function. IF A-D is high and B-C is low then node 60 will be at a higher voltage than node 61 and the current I will be steered through transistor 56 and thence, since transistor 52 if OFF, because of its differential connection with emitter 50b of transistor 50, through emitter 50b and through node 64 producing a low output for Q at terminal 65 corresponding to the OR function. The reverse of this input condition will produce the same result at the outputs. The universal form of gate illustrated in FIG. 2 requires somewhat more isolation than the basic embodiment of FIG. 1 by virtue of the collectors of the input tranistors which are tied in common through resistance R7. However, this universal gate has the added feature that solely by the external interconnection of input leads, the function of the gate can be changed from OR/NOR to AND/-NAND.

It is apparent also that there are other possible interconnection combinations of the four inputs A, B, C, and D. The two outputs are a function of four input variables and two portions of a full truth table have been shown to produce the AND/NAND and OR/NOR logic functions. Other entries in such a table may have particular specific applications even though certain entries may not produce standard output voltage levels. Moreover, the circuit embodiments in accordance with this invention are also adaptable for use in standard ECL and CECL circuits. In general, such adaptation requires the addition of level shifting at either the input or output and a doubling of either the drain current or of output resistors.

What is claimed is:
1. A noninverting current-mode logic AND gate comprising,
   1. a pair of input terminals,
   2. an output terminal,
   3. a source of substantially constant current, including a supply terminal adapted for connection to a source of voltage,
   4. a pair of differentially-connected, emitter-coupled, current steering transistors connected to said current source,
   5. a first input transistor having its base connected to one of said input terminals,
   6. a second input transistor having its base connected to the other input terminal,
   7. said input transistors having dual emitters,
   8. a reference transistor having its collector connected to said output terminal and having dual emitters,
   9. first means connecting one emitter of said first input transistor to one emitter of said reference transistor and to the collector of one of said current steering transistors,
   10. second means connecting one emitter of said second input transistor to the other emitter of said reference transistor and the other collector of the other of said current steering transistors,
   11. third means connecting the other emitter of said first input transistor to the base electrode of the other of said current steering transistors, and
   12. fourth means connecting the other emitter of said second input transistor to the base electrode of said one of the current steering transistors.

2. A noninverting current-mode logic gate comprising
   1. first and second input terminals,
   2. first and second output terminals,
   3. a source of substantially constant current, including a supply terminal adapted for connection to a source of voltage,
   4. a pair of differentially-connected, emitter-coupled current steering transistors connected to said current source,
   5. a reference transistor having its collector connected to said second output terminal and having dual emitters,
   6. a first input transistor having its base connected to said first input terminal, its collector to said first output terminal and its emitter to one emitter of said reference transistor,
   7. a second input transistor having its base connected to said second input terminal, its collector to said first output terminal and its emitter to the other emitter of said reference transistor,
   8. a third input transistor having its base connected to said first input terminal and its emitter to the base electrode of one of said current steering transistors,
   9. a fourth input transistor having its base connected to said second input terminal and its emitter to the base electrode of the other of said current steering transistors,
   10. said third and fourth input transistors having interconnected collector electrodes,
   11. means connecting the collector of said one current steering transistor to the emitter of said second input transistor,
   12. means connecting the collector of said other current steering transistor to the emitter of said first input transistor.

3. A current-mode logic gate in accordance with claim 2 in which the base electrode of said third input transistor is connected to said second input terminal instead of to said first input terminal and the base electrode of said fourth input transistor is connected to said first input terminal instead of to said second input terminal.

* * * * *